United States Patent
Salleo et al.

(10) Patent No.: US 7,964,440 B2
(45) Date of Patent: Jun. 21, 2011

(54) PHASE-SEPARATED COMPOSITE FILMS AND METHODS OF PREPARING THE SAME

(75) Inventors: Alberto Salleo, San Francisco, CA (US); Ana Claudia Arias, San Carlos, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 930 days.

(21) Appl. No.: 11/015,795

(22) Filed: Dec. 20, 2004

(65) Prior Publication Data

US 2006/0131563 A1   Jun. 22, 2006

(51) Int. Cl.
    *H01L 51/40* (2006.01)
(52) U.S. Cl. ............... 438/99; 257/40; 257/66
(58) Field of Classification Search .......... 438/99; 257/40, 66
    See application file for complete search history.

(56) References Cited

U.S. PATENT DOCUMENTS

| 6,391,217 | B2 | 5/2002 | Schaffer et al. | 216/41 |
| 6,746,825 | B2 | 6/2004 | Nealey et al. | 430/315 |
| 6,911,400 | B2 * | 6/2005 | Colburn et al. | 438/758 |

FOREIGN PATENT DOCUMENTS

WO  WO 02/084758 A1  10/2002

OTHER PUBLICATIONS

Copending U.S. Patent Application entitled "Method for Forming a Bottom Gate Thin Film Transistor Using a Blend Solution to Form a Semiconducting Layer and an Insulating Layer," filed Jun. 24, 2004.
M. L. Chabinyc et al., "Organic Polymer Thin-Film Transistors Fabricated by Selective Dewetting," Applied Physics Letters, 81, 4260 (2002).
C. R. Kagan et al., "Patterning Organic-Inorganic Thin-Film Transistors Using Microcontact Printed Templates," Applied Physics Letters 79(21) 3536 (2001).
Martin Böltau et al., "Surface-Induced Structure Formation of Polymer Blends on Patterned Substrates," Nature 391, 877 (1998).
Kim et al. "Epitaxial Self-Assembly of Block-Copolymers on Lithographically Defined Nanopatterned Surfaces," Nature 424, 411 (2003).
Ando et al., "Organic Thin-Film Transistors Fabricated with Alignment-Free Printing Technique," Materials Research Society Proceedings, 110.19.1 (Spring 2004),.

* cited by examiner

*Primary Examiner* — Matthew C Landau
*Assistant Examiner* — Colleen E Snow
(74) *Attorney, Agent, or Firm* — Oliff & Berridge, PLC

(57) ABSTRACT

Composite films formed from blends of semiconducting and insulating materials that phase separate on patterned substrates are provided. Phase separation provides isolated and encapsulated areas of semiconductor on the substrate. Processes for preparing and using such composite films are also provided, along with devices including such composite films.

20 Claims, 5 Drawing Sheets

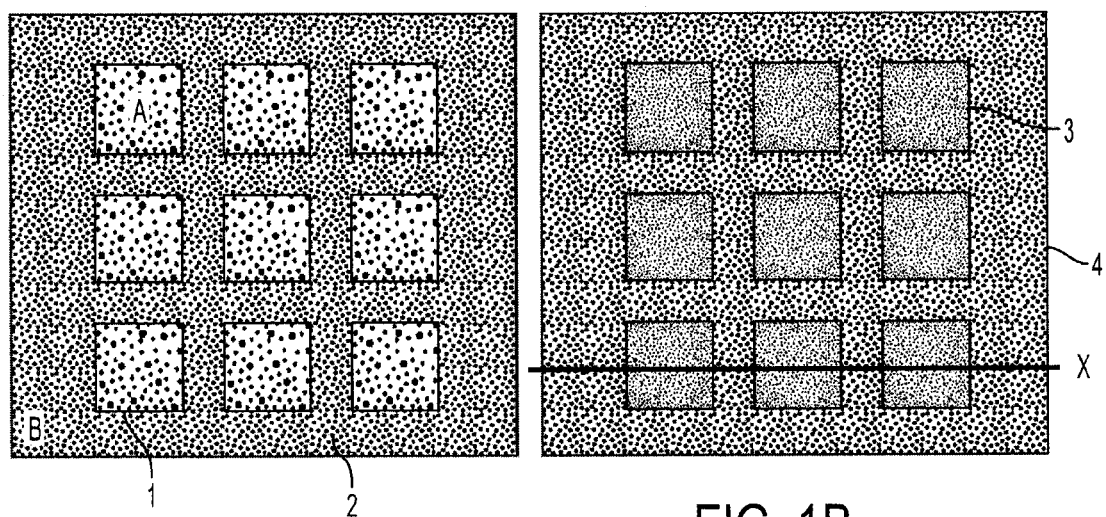
FIG. 1A
FIG. 1B
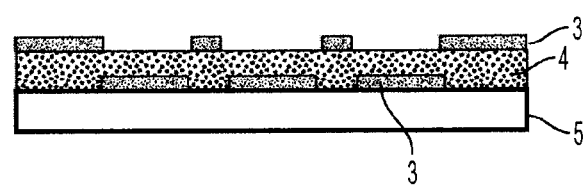
FIG. 1C

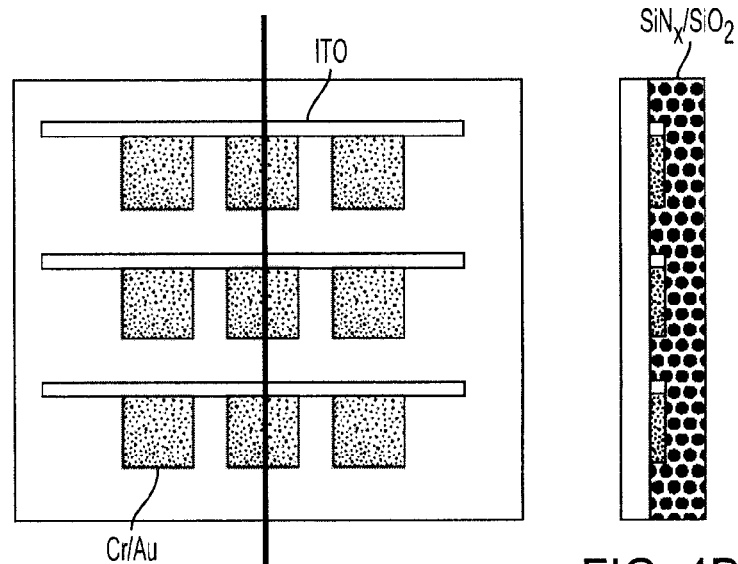
FIG. 4A
FIG. 4B
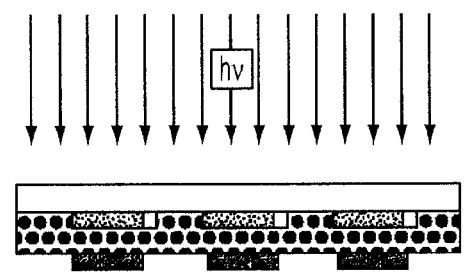
FIG. 4C
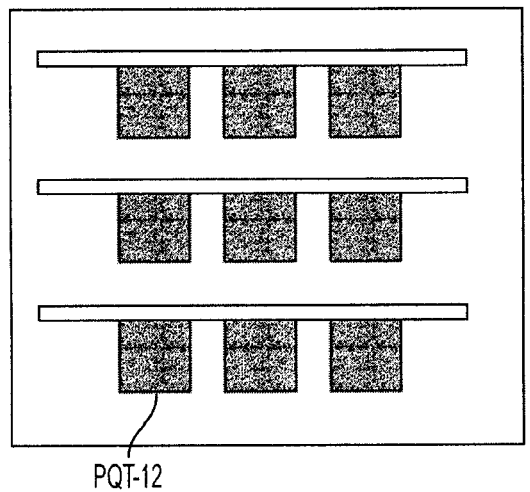
FIG. 4D

PHASE-SEPARATED COMPOSITE FILMS AND METHODS OF PREPARING THE SAME

This invention was made with Government support under Agreement No. 70NANBOH3033 awarded by NIST/ATP. The Government has certain rights in this invention.

BACKGROUND

As the demand for electronic and photonic devices grows, the need to reduce the cost of producing such devices for existing applications, such as computation, communications, electronics and displays, as well as for new applications, also grows.

Much of the cost of electronic devices is related to the processing steps needed to formulate the devices, rather than the materials costs. In large area applications, where arrays of thin-film transistors are employed, the costs associated with traditional processing methods can become particularly important.

Organic thin-film transistors have been and are being developed as low-cost alternatives to traditional inorganic semiconductors. In particular, organic semiconductors have been investigated for use in thin-film transistors, particularly in low-performance, large-area applications, such as liquid-crystal displays and electric paper, as well as in light-emitting diodes and photovoltaics. Organic semiconductors are also being investigated as alternatives to traditional inorganic materials for use as circuitry for plastics-based devices, because of their potential for lowering processing costs and for their compatibility with low-temperature processes.

Organic semiconductors can be processed into organic thin-film transistors at relatively low costs. Because organic semiconductors tend to be soluble and easily form continuous films, techniques such as jet printing, screen printing, micromolding and spin-coating followed by photolithography can all be used to fabricate patterned thin-film transistors using organic semiconductors, unlike traditional inorganic semiconductors.

For example, WO 02/084758 A1 discloses phase separation of polymer blends in relation to optoelectronic devices, and phase separation for encapsulation of thin-film transistors has also been studied and disclosed in copending U.S. Patent Application entitled "Method for Forming a Bottom Gate Thin Film Transistor Using a Blend Solution to Form a Semiconducting Layer and an Insulating Layer," filed Jun. 24, 2004 Ser. No. 10/876,229. Spontaneous dewetting of a semiconductor solution, for device array fabrication is described in M. L. Chabinyc et al., "Organic Polymer Thin-Film Transistors Fabricated By Selective Dewetting," Applied Physics Letters, 81, 4260 (2002). The disclosures of WO 02/084758 A1 and Chabinyc are incorporated herein by reference in their entireties.

C. R. Kagan et al., "Patterning Organic-Inorganic Thin-Film Transistors Using Microcontact Printed Templates," Applied Physics Letters 79(21) 3536 (2001), the disclosure of which is incorporated herein by reference in its entirety, discloses that patterned, solution-deposited, organic and inorganic thin-film transistors can be prepared by a low cost, low temperature process. The thin-film transistors of Kagan are produced by flooding a surface patterned with hydrophilic and hydrophobic regions with a thin-film precursor that selectively deposits on regions of like wettability.

In addition, lateral phase separation of polymer blends has been achieved on patterned substrates, for example, as disclosed in U.S. Pat. No. 6,391,217 and in Martin Böltau et al., "Surface-Induced Structure Formation of Polymer Blends on Patterned Substrates," Nature 391, 877 (1998), the disclosures of each of these references are incorporated herein in their entireties. In U.S. Pat. No. 6,391,217, polymer blends are deposited on a surface and lateral phase separation is patterned by application of an electric field, while Böltau discloses a method in which polymer blends laterally phase separate based on the patterned surface energy of the substrate.

In addition, the formation of phase-separated layers is known for block copolymers, and such phase separation can be driven by variations in the surface energy of the substrate on which the block copolymers are deposited. This can be seen, for example, in Kim et al. "Epitaxial Self-Assembly of Block-Copolymers on Lithographically Defined Nanopatterned Surfaces," Nature 424, 411 (2003) and in U.S. Pat. No. 6,746,825, the disclosures of each of these references are incorporated herein by reference in their entireties.

Surface energy patterning has also been shown to be effective to pattern metal contacts from nanoparticle solutions for semiconductor devices, as disclosed in Ando et al., "Organic Thin-Film Transistors Fabricated with Alignment-Free Printing Technique," Materials Research Society Proceedings, 110.19.1 (Spring 2004), the disclosure of which is incorporated herein by reference in their entireties. In Ando, a semiconductor is deposited on a substrate in a blanket layer from a single component solution or from vapor phase.

Conventional techniques require additional processing to encapsulate and/or isolate single devices. Thin-film transistors can be prepared by a combination of additive processes, such as such as ink-jet printing, screen printing, digital printing, micromolding and spin-coating, and subtractive processes, such as digital lithography and conventional photolithography. In these techniques, separate processing steps are still required to encapsulate and/or isolate single devices.

In particular, there remains a need for processes for preparing thin-film transistors in which semiconductor materials can be patterned and both encapsulated and isolated by insulating materials in a single step.

SUMMARY

Various of the above needs, and others, are addressed by the exemplary self-assembled phase-separated thin films, and process described herein.

Exemplary self-assembled phase-separated thin films formed from blends of semiconducting and insulating materials that phase separate laterally and vertically on a surface-energy patterned substrate are provided herein. Exemplary self-assembled phase-separated thin films are provided in which the semiconducting and insulating materials have phase-separated both laterally and vertically to provide isolated and encapsulated areas of semiconductors on the substrate. In addition, exemplary processes for preparing and using such self-assembled phase-separated thin films are provided.

Exemplary processes for preparing self-assembled phase-separated thin films comprise providing a substrate; patterning the surface energy of the substrate; depositing a solution that comprises one or more semiconducting material and one or more insulating material in one or more solvent onto the substrate; controlling the solvent evaporation rate to allow phase separation of the semiconducting material and the insulating material such that a patterned phase-separated film, in which regions of semiconducting material are isolated and encapsulated by the insulating material is produced.

In exemplary processes, self-assembled phase-separated thin films, which are comprised of one or more semiconducting materials and one or more insulating materials, are formed by providing a substrate; patterning the surface energy of the substrate; depositing a solution that comprises one or more semiconducting material and one or more insulating material in one or more solvent onto the substrate; controlling the solvent evaporation rate to allow phase separation of the semiconducting material and the insulating material such that a patterned phase-separated thin film, in which regions of semiconducting material are isolated and encapsulated by the insulating material, is produced.

Exemplary thin-film transistors comprise a substrate and a self-assembled phase-separated composite film, which are comprised of one or more semiconducting materials and one or more insulating materials that are formed by a process comprising providing a substrate; patterning the surface energy of the substrate; depositing a solution that comprises one or more semiconducting material and one or more insulating material in one or more solvent onto the substrate; controlling the solvent evaporation rate to allow phase separation of the semiconducting material and the insulating material such that a phase-separated film, in which regions of semiconducting material are isolated and encapsulated by the insulating material is produced.

BRIEF DESCRIPTION OF THE DRAWINGS

Other features will become apparent as the following description proceeds and upon reference to the drawings, in which:

FIGS. 1a-1c are schematic representations of an exemplary phase separated thin film;

FIGS. 4a-4d are schematic representations of stages in an exemplary phase-separated thin film production process.

DETAILED DESCRIPTION OF EMBODIMENTS

Figure 2A:
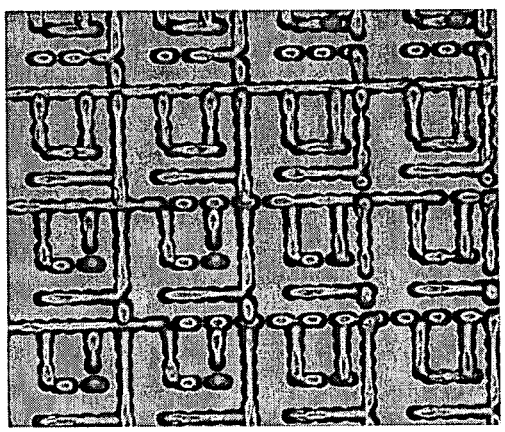
FIGS. 2a and 2b are optical micrographs of stages in an exemplary phase-separated thin film production process.

Exemplary phase-separated films provide superior thin-film devices, such as transistors and semiconductor arrays, while providing patterns of semiconducting materials that are isolated and encapsulated by insulating materials. While processes for preparing thin-film transistors for use in applications such as backplanes are described herein, it should be noted that the disclosed products and processes are generally applicable and may be used for any device in which semiconductor patterns must be separated and/or encapsulated by insulating regions.

In particular, exemplary phase-separated composite films formed from blends of semiconducting and insulating materials that phase separate laterally and vertically on a surface-energy patterned substrate, and processes for preparing and using such films are described herein. Exemplary composite films in which semiconducting and insulating materials have phase-separated both laterally and vertically to provide isolated and encapsulated areas of semiconductors on a substrate are further described. Methods of preparing such phase-separated thin films and thin-film transistors including such phase-separated thin films are described as well.

Substrates to be coated with polymer blends are provided and surface energies of substrates are patterned to form hydrophobic and hydrophilic areas. FIG. 1a is a graphical representation of such a pattern of hydrophobic areas 1 and hydrophilic areas 2. A blend of one or more semiconducting materials and one or more insulating materials in a solvent can be provided onto the surface. Solvent evaporation can be controlled, so that such blends phase separate vertically and laterally, to provide a phase-separated composite film. As shown in FIGS. 1b and 1c, blends of semiconducting and insulating materials phase may separate so that semiconducting materials 3 are deposited onto substrate 5 in areas corresponding to low energy or hydrophobic areas. Semiconducting materials 3 may be encapsulated and isolated by insulating materials 4, which surround deposited semiconducting materials and are deposited onto substrate 5 in areas corresponding to high energy or hydrophilic areas. In exemplary thin-film transistor preparation processes, semiconductor patterning steps may be unnecessary due to phase separation of a polymer blend of semiconducting and insulating materials.

Substrates used may be any suitable substrate and are not particularly limited. Suitable substrates for use include, but are not limited to, silicon dioxide, zirconium dioxide, hafnium dioxide, stainless steel, polyimides, polyvinyl phenols, polyvinyl alcohols, and mixtures thereof.

Surface energies of substrates may be patterned by any known or later developed method, provided that areas of low energy and areas of high energy are created. Suitable methods of patterning surface energies include, but are not limited to, digital lithography, photomasking, and shadow masking, followed or preceded by chemical treatments, and other known or later developed patterning methods.

Surface energies of substrates for phase-separated composite films may be patterned using any suitable masking or lithographic technique. In embodiments, masking agents may, for example, be applied to substrate surfaces by lithographic methods, and surface acting agents may, for example, be applied to masked surfaces to alter surface energies of exposed areas before both surface acting agents and masks are removed. In still other embodiments, the surface energy of the substrate may be chemically treated prior to masking.

Masks may be patterned in any effective and desired manner. Suitable masking agents include, but are not limited to, waxes, such as natural vegetable waxes, natural animal waxes, beeswax, mineral waxes, paraffin waxes, microcrystalline waxes, petroleum waxes, and synthetic waxes, and mixtures thereof, photoresist agents, and mixtures thereof.

Suitable surface acting agents include, but are not limited to, silanes, such as octyltrichlorosilane, hexamethyldisilazane (HMDS), thiols, phosphonic acids, and mixtures thereof.

Once the surface energies have been patterned, blends comprising one or more semiconducting materials and one or more insulating materials in a solvent system may be applied.

Semiconducting materials that may be used include, but are not limited to, semiconducting polymers, such as pyrolyzed polyacrylonitriles, pyrolyzed polyesters, polyaromatic polymers, regioregular poly(thiophenes) (for example, poly [5,5'-bis(3-dodecyl-2-thienyl)-2,2'-bithiophene] or PQT-12), poly(fluorenes) and polymers having highly conjugated systems; precursors of such polymers; aromatic compounds, such as solubilized anthracene; and mixtures and/or copolymers thereof. Semiconducting materials can be included in exemplary blends of semiconducting and insulating material in amounts in ranging from about 0.1 to about 99.9 percent by weight of the blend, or, in embodiments, in amounts ranging from about 20 to about 80 percent by weight of the blend, or, in particular embodiments, as 50 percent by weight of the blend.

Insulating materials that may be used include, but are not limited to, polymers, such as acrylates, polyalkyl acrylates, methacrylates, polyalkyl methacrylates, polyvinyl phenols, polyvinyl alcohols, precursors of such polymers and mixtures and/or copolymers thereof. Insulating materials can be included in exemplary blends of semiconducting and insulating materials in amounts ranging from about 0.1 to about 99.9 percent by weight of the blend, or, in embodiments, in amounts ranging from about 20 to about 80 percent by weight of the blend, or, in particular embodiments, as 50 percent by weight of the blend.

Exemplary ratios of semiconducting materials to insulating materials may be in a range of from about 1:0.1 to about 1:10. In embodiments, the ratio of semiconducting materials to insulating materials may be in a range of from about 20:80 to about 80:20, and in particular embodiments, the ratio may be in about 50:50.

Solvents that may be used include, but are not limited to, alcohols, toluene, dichlorobenzene, and mixtures thereof. Solvents can be included in exemplary blends of semiconducting and insulating materials in amounts in a range of from about 99.1 to about 0.1 percent by weight of the blend. In exemplary embodiments, the solvents may be included in the blends in amounts of about 95 percent by weight of the blend, and in additional embodiments, the solvents may be included in amounts of about 80 percent by weight of the blend.

Exemplary blends may be optionally homogenized by any known method before application. Homogenation may be carried out, for example, by agitation.

Methods by which blends of semiconducting materials, insulating materials and solvents may be applied to patterned surfaces are not particularly limited. Suitable methods include, but are not limited to, spin coating, dip coating, jet printing, screen printing and doctor-blading.

Once applied to a substrate, blends may phase separate during solvent evaporation to form composite films. Phase separation occurs in a solvent-rich film, where molecules are highly mobile. Thus, phase separation can be controlled by controlling solvent evaporation rates. For example, solvent evaporation rates can be controlled, in embodiments, by placing the substrate in a partially sealed enclosure or by using high boiling point liquids as solvents.

By patterning surface energies, phase separation can be controlled laterally and vertically. For example, where surface energies have been patterned to provide hydrophobic and hydrophilic regions, a blend of a regioregular poly (thiophene) semiconducting polymer and polymethylmethacrylate insulating material will separate such that the semiconducting polymer will deposit in strongly hydrophobic areas, displacing the insulating component laterally to hydrophilic areas and vertically. In addition, phase segregation is not sensitive to blend dispensing methods, and low cost methods such as spin-coating, dip-coating and doctor-blading may be employed without adversely affecting film properties.

Vertical phase separation produces smooth edges and interfaces between semiconducting and insulating materials that are detectable by optical microscopy. In addition, phase separated thin films are composed of different phases that contain all elements of the initial solution, which can be detected by analytic techniques, such as a scanning electron microscope.

Exemplary processes allow fabrication of thin-film transistor devices by a single application of semiconducting and insulating materials. That is, it is not necessary to apply semiconducting materials and insulating materials in separate steps.

Exemplary processes provide automatic isolation of semiconducting materials to form thin-film transistors that do not interfere with one another.

Exemplary processes provide thin-film transistors that are encapsulated by insulating materials, which reduces degradation of the thin-film transistors.

Furthermore, exemplary processes provide thin-film transistor channels that are formed on hydrophobic areas of patterned substrates; such hydrophobic regions have high mobility characteristics.

These following examples are intended to be illustrative, not limiting. All parts and percentages are by weight unless otherwise indicated.

EXAMPLES

Example 1

Figure 2B:
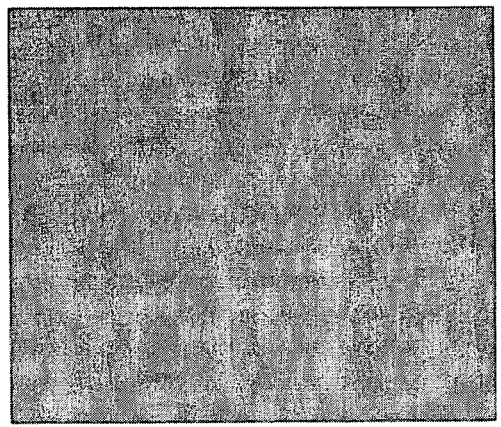

The surface energy of a $SiO_2$ substrate is patterned by digital lithography. A wax mask is printed on the substrate surface, as shown in FIG. 2a. The masked substrate is then dipped in a solution of octyltrichlorosilane in hexadecane for 15 minutes and then rinsed in heptane. The wax mask is stripped using THF. As a result of the above treatment, a latent surface energy pattern is formed in which the areas that had been masked are hydrophilic, while the areas that had been exposed to the octyltrichlorosilane solution are hydrophobic A 1:5 PQT-12:polymethyl methacrylate (PMMA) in dichlorobenzene blend is spin coated onto the patterned substrate. The dichlorobenzene solvent is allowed to evaporate slowly by placing the substrate in a closed Petri dish until a self-assembled monolayer is formed and dried at room temperature over several hours. Once the blend is evenly dispensed on the substrate and the solvent evaporates, PQT-12 segregates to form thin-film transistor channels and the PMMA segregates on the substrate surface in hydrophilic areas. The PMMA thus effectively isolates and encapsulates individual semiconducting thin-film transistor devices. The pattern of PQT-12 semiconductor, which appears as a negative image of the wax pattern, is visible through the PMMA in the dry film, and can be seen clearly, as in FIG. 2b, after the PMMA is removed with toluene.

Example 2

Figure 3A:
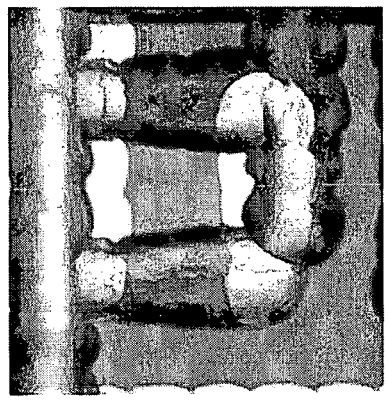
FIGS. 3a and 3b are micrographs of exemplary thin-film transistors.

The surface energy of a $SiO_2$ substrate is patterned by digital lithography. A wax mask is printed on the substrate surface, as shown in FIG. 3a. The masked substrate is then dipped in a solution of octyltrichlorosilane in hexadecane for 15 minutes and then rinsed in heptane. The wax mask is stripped using THF. As a result of the above treatment, a latent surface energy pattern is formed in which the areas that had been masked are hydrophilic, while the areas that had been exposed to the octyltrichlorosilane solution are hydrophobic.

Figure 3B:
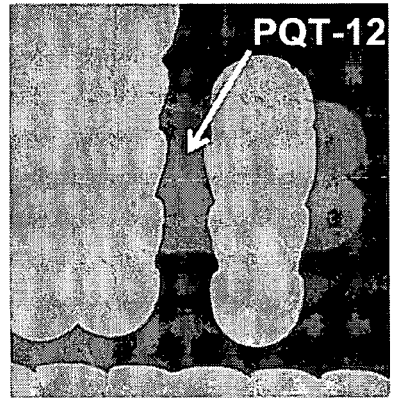

A 1:5 PQT-12:polymethyl methacrylate (PMMA) in dichlorobenzene blend is spin coated onto the patterned substrate. The dichlorobenzene solvent is allowed to evaporate slowly by placing the substrate in a closed Petri dish until a self-assembled monolayer is formed and dried at room temperature over several hours. FIG. 3b is an optical micrograph of the thin-film transistor array of Example 2 after the PMMA was removed with toluene.

Figure 3C:
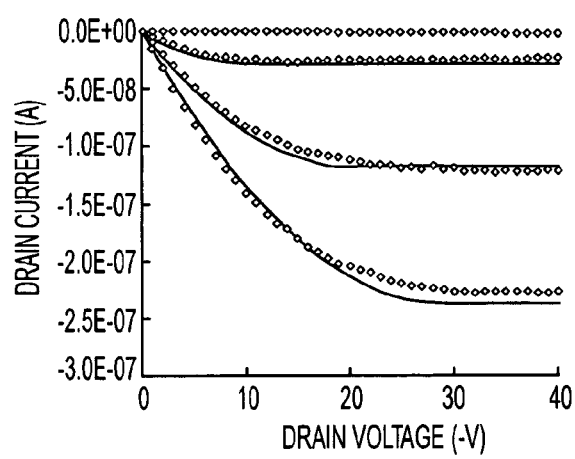
FIG. 3c is a graphical representation of the relationship between drain voltage and drain current for such exemplary thin-film transistors.
Figure 5A:
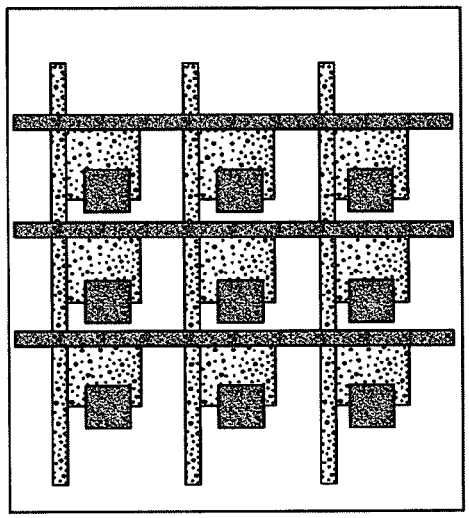
FIG. 5 is a schematic representation of an exemplary process of preparing a thin film transistor array.
Figure 5B:
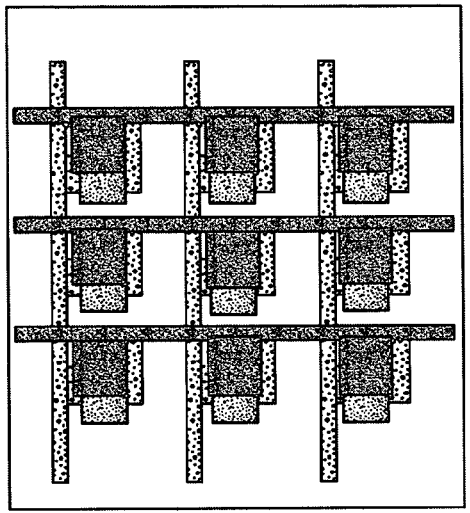
Figure 5C:
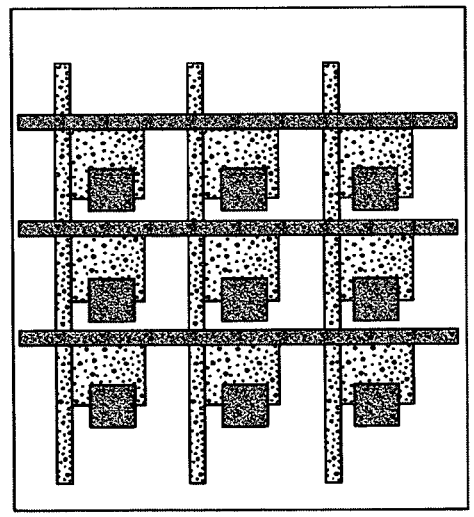
Figure 5D:
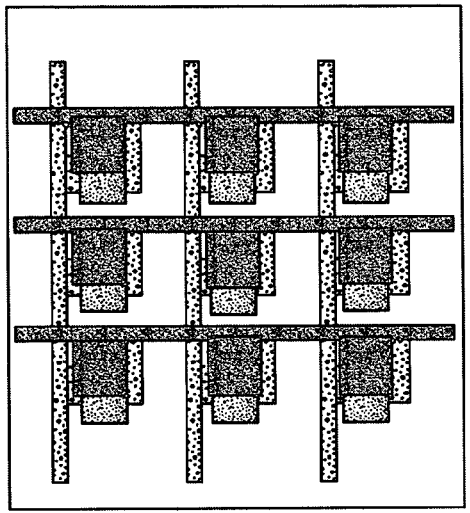

FIG. 3c is a graphical representation of the relationship between drain voltage and drain current for a thin-film transistor in the array of Example 2. This relationship, shown by the solid line in FIG. 3c, closely follows the expected behavior of a thin film transistor having a carrier motility of approximately $7.5 \times 10^{-3}$ cm$^2$/V·s and a threshold voltage of approximately −10 V.

Example 3

Self-aligned thin-film transistors are prepared by applying a photoetch-able chemical treatment to a transparent SiN$_x$/SiO$_2$ substrate having Cr/Au gate electrodes (FIGS. 4a and 4b). The gate lines of the devices are transparent, but the gate electrodes are opaque. The substrate is photo-irradiated, as shown in FIG. 4c; exposed areas corresponding to transparent regions are rendered hydrophilic by photoetching, and the gate electrodes, which were not photoetched, remain hydrophobic. The resulting pattern consists of isolated thin-film transistors that have self-aligned to the gate electrodes, as shown in FIG. 4d.

Example 5

A wax mask is printed on a substrate surface previously coated by immersing the substrate surface in a solution of octyltrichlorosilane in hexadecane for 15 minutes and then rinsing the substrate surface in heptane. The masked substrate is then treated by plasma etching. The wax mask is stripped using THF. As a result of the above treatment, a latent surface energy pattern is formed in which the areas that had been masked are hydrophobic, while the areas that had been exposed to the plasma etching are hydrophilic.

A 1:5 PQT-12:polymethyl methacrylate (PMMA) in dichlorobenzene blend is spin coated onto the patterned substrate. The dichlorobenzene solvent is allowed to evaporate slowly by placing the substrate in a closed Petri dish until a self-assembled monolayer is formed and dried at room temperature over several hours. Once the blend has been evenly dispensed on the substrate and the solvent evaporated, PQT-12 segregates to form thin-film transistor channels and the PMMA segregates on the substrate surface in hydrophilic areas. The PMMA thus effectively isolates and encapsulates individual semiconducting thin-film transistor devices. The pattern of PQT-12 semiconductor appears as a positive image of the wax pattern.

While exemplary embodiments have been described above, various alternatives, modifications, improvements, and/or substantial equivalents, whether known or that are, or may be, presently unforeseen, may become apparent to those having at least ordinary skill in the art. Accordingly, the exemplary embodiments as set forth above are intended to be illustrative, not limiting.

What is claimed is:

1. A process of preparing a phase-separated film, comprising:
   providing a substrate;
   patterning a surface energy of a surface of the substrate;
   depositing a solution onto the surface having patterned surface energy, the solution comprising one or more semiconducting material and one or more insulating material, the ratio of the semiconducting material to the insulating material is in a range of from about 20:80 to about 80:20, in one or more solvent; and
   controlling, using a partially sealed environment, an evaporation rate of the solvent to allow phase separation of the semiconducting material and the insulating material;
   wherein the phase separation comprises lateral phase separation and vertical phase separation within the deposited solution and results in a composite film in which regions of semiconducting material are isolated and encapsulated by the insulating material.

2. The process according to claim 1, wherein the composite film is a member chosen from the group consisting of thin-film transistors, transistor arrays, and semiconductor device arrays.

3. The process according to claim 1, wherein the substrate is a member chosen from the group consisting of silicon dioxide, zirconium dioxide, hafnium dioxide, stainless steel, polyimides, polyvinyl phenols, polyvinyl alcohols and mixtures thereof.

4. The process according to claim 1, wherein the semiconducting material is at least one member chosen from the group consisting of pyrolyzed polyacrylonitriles, pyrolyzed polyesters, polyaromatic polymers, regioregular poly(thiophenes), polymers having highly conjugated systems, precursors of such polymers, copolymers of such polymers, aromatic compounds, and mixtures thereof.

5. The process according to claim 1, wherein the insulating material is at least one member chosen from the group consisting of acrylates, methacrylates, polyalkyl acrylates, polyalkyl methacrylates, copolymers, precursors, and mixtures thereof.

6. The process according to claim 1, wherein the solvent is at least one member chosen from the group consisting of toluene, alcohols, dichlorobenzene, and mixtures thereof.

7. The process according to claim 1, wherein patterning the surface of the substrate includes providing a pattern of hydrophobic regions and hydrophilic regions on the surface.

8. The process according to claim 7, wherein the semiconducting material segregates to hydrophobic areas on the patterned surface and the insulating material segregates to hydrophilic areas on the patterned surface.

9. The process according to claim 1, wherein patterning the surface of the substrate comprises:
   patterning a masking layer onto the surface to produce a masked surface;
   exposing the masked surface to a hydrophobicity inducing agent;
   rinsing the masked surface; and
   removing the masking layer.

10. The process according to claim 1, wherein lateral phase separation and vertical phase separation are controlled by the surface energy.

11. A phase-separated composite film comprising one or more semiconducting material and one or more insulating material, the ratio of the semiconducting material to the insulating material is in a range of from about 20:80 to about 80:20, wherein the phase-separated composite film is formed by a process comprising:
   patterning energy of a surface of the substrate;
   depositing a solution onto the patterned surface, the solution comprising one or more semiconducting material and one or more insulating material in one or more solvent; and
   controlling, using a partially sealed enclosure, an evaporation rate of the solvent to allow phase separation of the semiconducting material and the insulating material;
   wherein the phase separation comprises lateral phase separation and vertical phase separation within the deposited solution and results in a composite film in which regions of semiconducting material are isolated and encapsulated by the insulating material.

12. A thin film transistor comprising a substrate and a phase-separated film, wherein the phase-separated film comprises one or more semiconducting material and one or more insulating material, the ratio of the semiconducting material to the insulating material is in a range of from about 20:80 to about 80:20, and wherein the phase-separated film is formed by a process comprising:

patterning energy of a surface of the substrate;
   depositing a solution onto the patterned surface, the solution comprising one or more semiconducting material and one or more insulating material in one or more solvent; and
   controlling, using a partially sealed environment, an evaporation rate of the solvent to allow phase separation of the semiconducting material and the insulating material;
   wherein the phase separation comprises lateral phase separation and vertical phase separation within the deposited solution and results in a composite film in which regions of semiconducting material are isolated and encapsulated by the insulating material.

13. The phase-separated thin film transistor according to claim 12, wherein the substrate is a member chosen from the group consisting of silicon dioxide, zirconium dioxide, hafnium dioxide, stainless steel, polyimides, polyvinyl phenols, polyvinyl alcohols and mixtures thereof.

14. The phase-separated thin film transistor according to claim 12, wherein the semiconducting material is at least one member chosen from the group consisting of pyrolyzed polyacrylonitriles, pyrolyzed polyesters, polyaromatic polymers, regioregular poly(thiophenes), polymers having highly conjugated systems, precursors of such polymers, copolymers of such polymers, aromatic compounds, and mixtures thereof.

15. The phase-separated thin film transistor according to claim 12, wherein the insulating material is at least one member chosen from the group consisting of acrylates, methacrylates, polyalkyl acrylates, polyalkyl methacrylates, copolymers, precursors, and mixtures thereof.

16. The phase-separated thin film transistor according to claim 12, wherein the solvent is at least one member chosen from the group consisting of toluene, alcohols, dichlorobenzene, and mixtures thereof.

17. The phase-separated thin film transistor according to claim 12, wherein the phase separation provides areas of semiconducting material adhered to the surface and the areas of semiconducting material are isolated or encapsulated by the insulating material.

18. The phase-separated thin film transistor according to claim 12, wherein patterning energy of a surface of the substrate includes providing a pattern of hydrophobic regions and hydrophilic regions on the surface.

19. The phase-separated thin film transistor according to claim 18, wherein the semiconducting material adheres to hydrophobic areas on the patterned surface and the insulating material adheres to hydrophilic areas on the patterned surface.

20. The phase-separated thin film transistor according to claim 12, wherein lateral phase separation and vertical phase separation are controlled by the surface energy.

\* \* \* \* \*

UNITED STATES PATENT AND TRADEMARK OFFICE
CERTIFICATE OF CORRECTION

| | |
|---|---|
| PATENT NO. | : 7,964,440 B2 |
| APPLICATION NO. | : 11/015795 |
| DATED | : June 21, 2011 |
| INVENTOR(S) | : Alberto Salleo et al. |

It is certified that error appears in the above-identified patent and that said Letters Patent is hereby corrected as shown below:

In the Specification

Column 1, line 5, after "Agreement No.", please delete "70NANBOH3033" and insert --70NANB0H3033--.

Signed and Sealed this
Third Day of September, 2013

Teresa Stanek Rea
*Acting Director of the United States Patent and Trademark Office*